United States Patent [19]

Coulter

[11] Patent Number: 4,531,229
[45] Date of Patent: Jul. 23, 1985

[54] METHOD AND APPARATUS FOR IMPROVING BINAURAL HEARING

[75] Inventor: David C. Coulter, Vienna, Va.

[73] Assignee: Coulter Associates, Inc., Vienna, Va.

[21] Appl. No.: 436,041

[22] Filed: Oct. 22, 1982

[51] Int. Cl.³ .................. H04B 15/00; H04R 25/00
[52] U.S. Cl. ....................................... 381/68; 381/74
[58] Field of Search ............... 381/1, 24, 25, 28, 68, 381/69, 74; 179/107 R, 107 FD

[56] References Cited

U.S. PATENT DOCUMENTS

| | | | |
|---|---|---|---|
| 2,837,607 | 6/1958 | McGee | 179/107 R |
| 3,509,289 | 4/1970 | Briskey et al. | 179/107 R X |
| 4,181,818 | 1/1980 | Shenier | 381/74 X |
| 4,405,831 | 9/1983 | Michelson | 381/68 |
| 4,425,481 | 1/1984 | Mansgold et al. | 381/68 X |

FOREIGN PATENT DOCUMENTS

| | | | |
|---|---|---|---|
| 3032311 | 3/1981 | Fed. Rep. of Germany | 179/107 R |
| 1099344 | 1/1968 | United Kingdom | 179/107 R |
| 1565701 | 4/1980 | United Kingdom | 179/107 R |

OTHER PUBLICATIONS

Allied Radio, 1967 Catalog (1966), p. 160.
Radio Shack, 1980 Catalog (1979), pp. 37 and 46.
Stereo Catalog, 1981 (1980), Ziff & Davis Publishing Co., p. 208.

Primary Examiner—R. J. Hickey
Attorney, Agent, or Firm—Epstein & Edell

[57] ABSTRACT

A method and apparatus for improving binaural auditory response for the hearing impaired employs a console in which two microphones are mounted flush with the top surface of the console to eliminate pick up of surface reflections and in which the microphones are spaced to optimize binaural response. The console is adapted to be supported on a table, or the like, to place the microphones closer to the source of sound than is possible with body-attached microphones. Processing circuitry in the console includes two separate signal channels in which the gains are automatically controlled with a common AGC circuit having a fast response section for eliminating sudden noises and a slow response section for controlling the average amplitude level. The fast response section is biased to require a higher level input signal before responding in order to prevent it from cutting off the onset of normal sounds. The AGC circuit is controlled by the channel which receives the higher level signal. The console output signals are transmitted by cable or wireless transmission to respective earphones, with individual channel level adjustment controls being interposed in the transmission path. A plurality of users can listen to the console output simultaneously and can control the volume in each channel independently and independently of other users.

23 Claims, 6 Drawing Figures

U.S. Patent  Jul. 23, 1985  Sheet 1 of 3  4,531,229
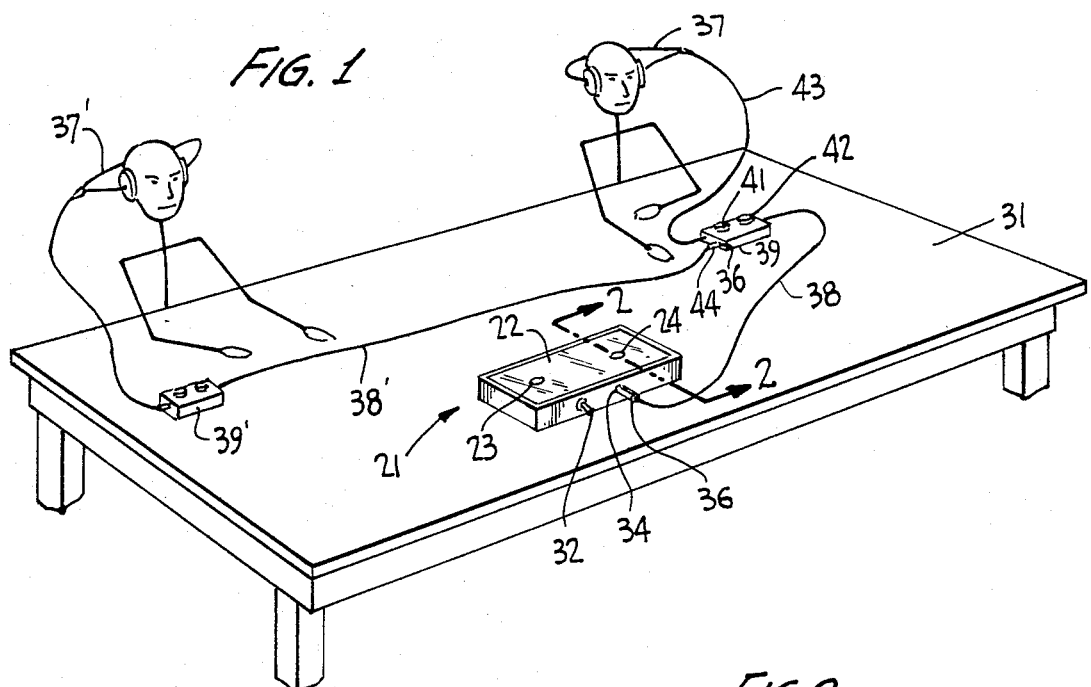
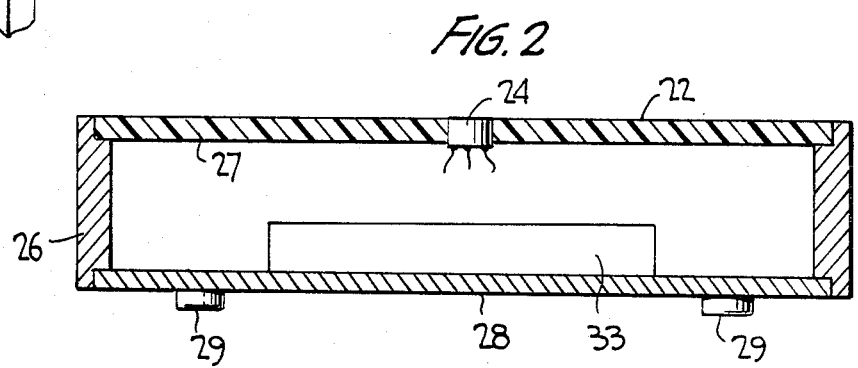
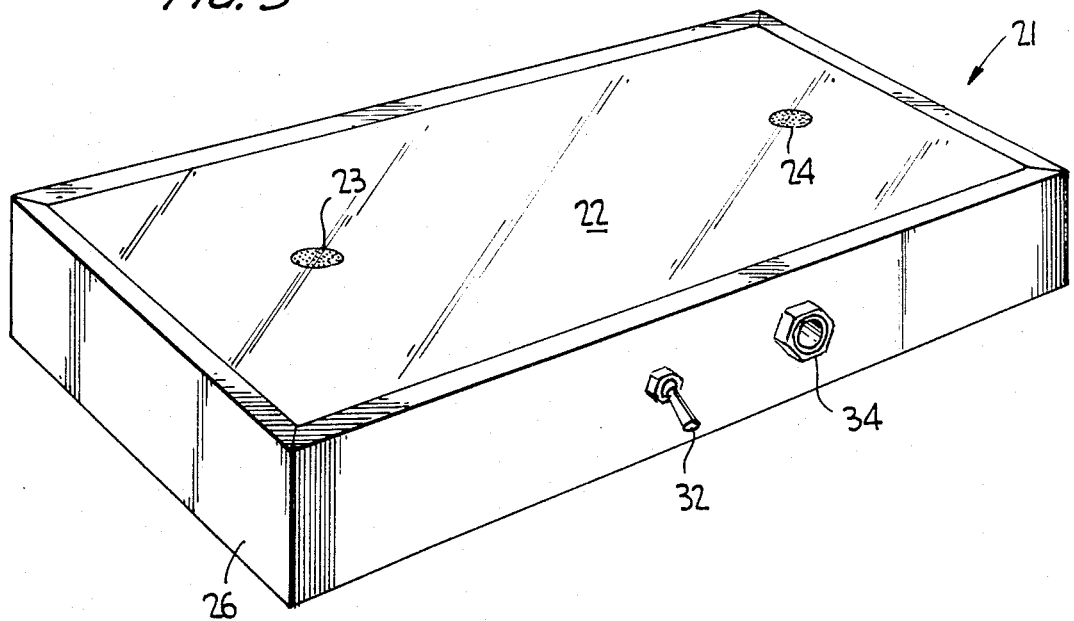

METHOD AND APPARATUS FOR IMPROVING BINAURAL HEARING

BACKGROUND OF THE INVENTION

1. Technical Field

The present invention relates to a method and apparatus for enhancing the auditory capability of hearing impaired persons. More particularly, the present invention relates to improving the binaural hearing response of hearing impaired persons.

2. The Prior Art

It has long been recognized that the optimal method of improving the hearing response of hearing impaired individuals is to improve their binaural hearing capability. Examples of prior art devices which attempt to improve binaural hearing may be found in U.S. Pat. Nos. 3,894,196 (Briskey), 3,509,289 (Briskey et al) and 2,930,858 (Hollingsworth). In addition, the subject is discussed in considerable detail in Chapter 41 of the "Handbook of Clinical Audiology", edited by Katz, which chapter is entitled "Binaural Hearing Aids and New Innovations", by Robert A. Briskey, and which appears at pages 501–507 of the text. The latter text book chapter is expressly incorporated herein by reference, in its entirety, insofar as it discloses background material and represents the state of the art.

Binaural auditory enhancement involves using two separate microphones, each feeding its received signal through its own channel or processing circuit, to deliver the separately received signals to respective earphones. The above-referenced Briskey textbook chapter points out that binaural hearing is considerably more sensitive than monaural hearing. In addition, binaural hearing, partly because of the slight phase difference between the received signals caused by microphone spacing, significantly improves sound direction discrimination. The prior art has attempted to use these characteristics of binaural hearing in hearing aids of the head-worn or body-attached type, such as hearing aids built into eyeglasses, on-the-ear aids, pocket clip-on devices or in-the-ear instruments. Such head-worn or body-attached hearing aids, however, have generally sacrificed function for cosmetics and have, therefore, not been able to take full advantage of the auditory enhancement provided by a binaural microphone system. More specifically, the hearing aid microphones, being located on the headworn or body-attached device, are relatively remote from the source of the sound of interest. As a consequence, considerable gain is required in the individual channels to boost the received signals to a usable level. This high gain arrangement, in turn, causes considerable discomfort when sudden loud sounds are picked up in one or the other microphone. In addition, feedback ringing or squealing can often result if the microphone is not properly acoustically insulated from its corresponding earphone. Proper insulation adds considerably to the expense and complexity of the device.

Apart from the remote location of the microphone relative to the sound source, another reason for the failure of prior art binaural hearing aids to take full advantage of the improvements inherent in binaural systems concerns acoustic reflections resulting from microphone mounting arrangements. Specifically, microphones are often mounted to project from the surface of the supporting structure. Reflections from the mounting structure surface which reach the microphone are often 180° out of phase with the unreflected received signals, thereby producing nulls in the channel response. Moreover, phase differences between the reflected and unreflected picked up sounds can often mask the phase difference required between the channels in a binaural system.

The aforementioned Briskey et al patent discloses a binaural hearing aid which is intended to maintain or enhance the inter-aural level differential between the contralateral and ipsilateral sounds received at the furthest and nearest ears, respectively, with respect to the sound source. Briskey et al recognize that this difference in sound level, although minute, is important because it is part of the process which permits a listener to perceive relative direction of sound. The problem with devices used prior to Briskey et al is that the separate automatic gain control (AGC) circuits employed in each channel adjusted the gain in a manner which is inversely proportional to the input signal level in that channel, with the result that the inter-aural level difference was largely eliminated. Briskey et al solved this problem by providing interchannel control signals for the respective AGC circuits to maintain the inter-aural level difference. This technique works quite well in an ideal system, but it does not accommodate changes in individual circuit components resulting from aging, wear and tear, etc., which changes cause the AGC circuit response to change in a manner which cannot be predicted at the time of manufacture. Moreover, the use of two AGC circuits results in greater expense and the need for more space than would be required by a single AGC circuit.

OBJECTS AND SUMMARY OF THE INVENTION

It is, therefore, an object of the present invention to provide a method and apparatus for improving auditory capability of the hearing impaired by means of binaural techniques wherein microphones can be located closer to the sound source and mounted such that acoustic reflections can be eliminated.

It is another object of the present invention to provide a method and apparatus to improve binaural hearing using a common circuit to achieve automatic gain control in two channels while maintaining the desired inter-aural level difference in the channels.

Still another object of the present invention is to automatically control the gain in a device for the hearing impaired such that sudden sharp noises are substantially eliminated but speech and other continuous sounds are reproduced with high fidelity.

As noted above, prior art hearing aid design is almost always influenced by cosmetic appearance. As a consequence, the prior art devices for the hearing impaired have been designed to be as inobtrusive as possible and, as a result, have sacrificed the real function of the device, namely to improve hearing. In accordance with the present invention, microphones spaced for binaural pick up are mounted flush with the exposed top surface of a portable console which is adapted to rest on a table or other support structure. The console can be optimally positioned closer to a talker or other source of sound than is possible with head-worn or body-attached microphones. In addition, the spaced microphones are mounted flush with the top surface of the console in order to eliminate reception at the microphones of acoustic energy reflected from that surface. Further, the microphones are of the omnidirectional type.

The console houses separate signal channels, one for each microphone, with respective adjustable gain amplifiers that are controlled by a common AGC circuit having both fast and slow acting circuit sections. The fast-acting section eliminates all sharp noises from the response in both channels while the slow-acting section maintains a selectable comfortable volume range for ambient sounds and longer term sounds of interest, such as speech, music, etc. The fast-acting control section is biased to prevent it from affecting the gain unless the input signal level is higher than a predetermined threshold. This feature is provided in order to avoid the situation wherein the fast-acting section acts to attenuate the onset of words and other sudden amplitude increases in the normal sound of interest. The common AGC control circuit receives signals from both channels and is arranged to be controlled by the channel having the highest signal level.

The output signals from the two channel circuits in the console are transmitted to respective earphones. Transmission may be via a cable which plugs into the console or by wireless transmission, such as radio waves, infrared waves, etc. Separate volume controllers for each channel may be disposed in the console or in the transmission path between the console and the earphones. Alternatively, a balance control, combined with a single volume control, may be employed. In the cable transmission embodiment, a control box is employed and is connected by cable to the console. The amplified binaural signals are then passed through adjustable resistors to respective earphones. An output jack is provided on the control box which permits the binaural signal to bypass the adjustable resistors and transmit it directly to another control box wherein the signal levels can be selectively adjusted for another user of the system. Multiple control boxes can be employed in this manner, with each control box plugging in to a preceding control box, and each control box having its own pair of channel volume controls.

In the wireless transmission embodiment, multiple consoles can be dispersed throughout a home or office. If the transmission is FM radio transmission and is at the same frequency from each console, an "FM capture effect" results in automatic cut-off of reception from other consoles when the reception from one console is at a higher level than from the others by a predetermined amount, nominally six dB. This permits the user to walk from room to room and hear only sounds picked up at the closest console, thereby simulating actual hearing to a greater degree than would be the case if transmissions from all of the consoles were picked up simultaneously.

BRIEF DESCRIPTION OF THE DRAWINGS

The above and still further objects, features and advantages of the present invention will become apparent upon consideration of the following detailed description of specific embodiments thereof, especially when taken in conjunction with the accompanying drawings, wherein:

FIG. 1 is a partially diagrammatic view in perspective of one embodiment of the present invention in use;

FIG. 2 is a view in section taken along lines 2—2 of FIG. 1;

FIG. 3 is a view in perspective of a console portion of the present invention;

DESCRIPTION OF THE PREFERRED EMBODIMENTS

Figure 4:
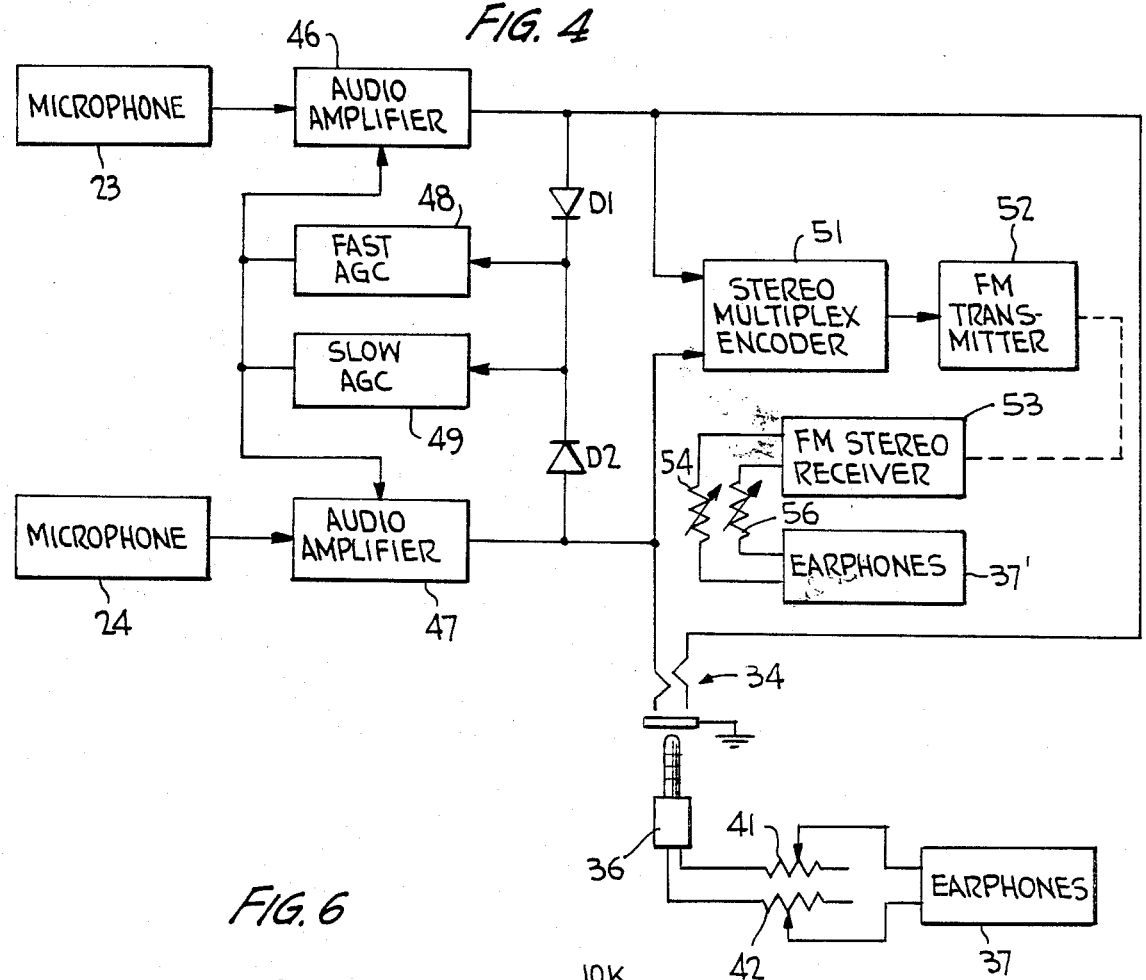
FIG. 4 is a functional block diagram of the system of the present invention.

Referring specifically to FIGS. 1, 2 and 3 of the accompanying drawings, a portable housing or console 21 has an exposed top surface 22 in which a pair of spaced microphones 23 and 24 are substantially flush-mounted. The overall configuration of the portable console 21 is not crucial to the present invention except that the structure should accommodate the following requirements. First, the microphones 23, 24 should be mounted substantially flush with the exposed surface 22 which is preferably, although not necessarily in all cases, upward-facing when the console is deployed for use. Second, the exposed surface 22 must have at least one dimension which permits the microphones to be spaced suitable for binaural pickup. In this regard, the microphone spacing can be anywhere in the range of 3 to 14 inches, with the narrower range of 8 to $10\frac{1}{2}$ inches being preferable for the present invention. Within these restrictions, the configuration of portable console 21 can vary considerably. In the preferred embodiment illustrated in FIGS. 1–3, console 21 takes the form of a rectangular frame 26. Front and rear walls 27 and 28 are secured to the front and rear, respectively, of the frame 26 to define an enclosed volume between these walls and the frame. The exposed surface of front wall 27 constitutes exposed surface 22 of the console. Microphones 23 and 24 are, therefore, mounted in front wall 27 with their exposed ends substantially flush with surface 22. Exposed surface 22 is also preferably made reflective, solely for appearance purposes. Four short, rectangularly spaced and vibration-isolating legs 29 are secured to the exposed surface of rear wall 28 to support the console slightly above a flat support surface, such as the top of a table 31. Legs 29 are preferably made of rubber or other similar high friction, non-scratching material.

An on-off switch 32 is mounted in frame 26 to be accessible for actuation and de-actuation by a user of the system. Switch 32 alternatively supplies and interrupts primary power to processing circuitry 33 disposed within the enclosed console volume. A dual signal jack connector 34 is also mounted on frame 26 in a position wherein it is accessible for mating engagement with a cable plug 36.

Console 21 may be used in conjunction with earphones 37 of one or more hearing-impaired users by either wireless transmission or cable transmission. In the cable transmission mode, plug 36 is connected at the end of a cable 38 which conducts binaural signals, as processed by circuitry 33, to a control box 39. The control box has separate volume controls 41, 42 to permit the hearing-impaired user of the control box to adjust the volume in each of the binaural channels to suit his or her own needs. The volume-adjusted signals are then passed to the earphones 37 via cable 43 which plugs into control box 39. The control box also has a dual-signal jack connector 44 which is substantially identical to console jack connector 34 and which provides the console output binaural signal as a passthrough signal (i.e., without amplitude adjustment by volume controls 41,42). This permits a second control box 39', identical to control box 39, to receive the passed-through console output signal via a cable 38' and plug connector 36' which are identical to cable 38 and plug connector 36, respectively. In this manner, multiple control boxes can be connected in a chain to provide respective users with access to the binaural console output signal. Each control box has its own volume controls for each channel so that each user can adjust the channel amplitudes independently of one another and independently of the other console users.

Alternatively, transmission from the console 21 to the earphones 37 may be via wireless transmission using substantially any wireless transmission medium, such as radio waves, infrared waves, etc. In a preferred wireless transmission embodiment, FM radio transmission is employed. Under such circumstances, the processed binaural signal is transmitted from console 21 as frequency modulation of a low power carrier signal. Preferably, the carrier signal has a frequency which resides in the commercial FM broadcast band of 88 MHz to 108 MHz and which frequency is not assigned in the geographic region in which the console is being used. The user may then receive the console-transmitted signal on a standard commercial FM receiver tuned to the transmission carrier frequency. Such receiver would normally have a balance control and a volume control to permit channel amplitude adjustment. Alternatively, the receiver would preferably include two volume controls, one for each of the received channel signals.

For both the wireless and wired transmission embodiments, earphones 37, 37' are located remote from the console so that the console-mounted speakers can be located considerably closer to the source of sound than is the user or wearer of the earphones. This improves both the speech-to-noise ratio and the ratio of direct signal level to reflected signal level as compared to the body-worn or body-attached systems. For example, a user can place the console in front of the person sitting across a table or on the desk of such a person, while the user sits at the far end of the table or across the room. In any case, the binaural acoustic signal received at the console travels a much shorter distance and is, therefore, much less attenuated and generally less degraded than is the case when the microphones are attached to the user. The console may also be placed near the loudspeakers of a television or audio system to receive, process and transmit the signal to plural users who can adjust the amplitude of each channel to fit their individual needs.

The proximity of the console to the talker rather than to the listener results in a requirement for less gain in the processing circuit. This, along with the remote location of the earphones from the microphones on the console, substantially eliminates acoustic feedback ringing or squealing.

Microphones 23 and 24 are conventional omni-directional microphones. By virtue of their mounting being substantially flush with the exposed top surface 22, acoustic reflections from that surface are not picked up and, therefore, cannot distort the received signal. In this regard, it is also important that the exposed surface 22 not be recessed below the forward edge of frame 26 or, if so recessed, that the recess be on the order of ⅛ inch or less. This prevents reflections between the frame sides in the space above the microphones. The combination of the binaural spacing between the microphones, the absence of the reflections and the omni-directional reception provides for high fidelity pick up of acoustic signals.

It should be noted that control box 39 may be dispensed with, whereupon the individual channel amplitude controls may be placed at the console or earphones. For multiple users, multiple dual signal jacks can be provided, each having a pair of channel amplitude controls associated therewith. However, especially for multiple user applications, the individual control box approach is more desirable.

The FM transmission embodiment has the advantage of permitting the user to move about without being connected by wire to the console. Another distinct advantage of the FM transmission embodiment arises in applications where plural consoles can be located in different rooms of a house or of a building. If each console transmits at the same carrier frequency, user-carried receivers can move from room to room and receive only the signal from the closest console at any time. This results from the "FM capture" effect whereby an FM receiver picks up only the stronger of two signals within its receiving range. The resulting reception is, therefore, more realistic and similar to unaided hearing whereby the listener hears primarily only the sounds in the room in which he or she is located at any time. If not for the "FM capture" effect, the user would hear transmissions from all of the consoles simultaneously.

A functional block diagram of the preferred embodiment of the present invention is illustrated in FIG. 4. The spaced omni-directional microphones 23, 24 transduce the received acoustic signal into electrical signals that are applied to respective audio amplifiers 46 and 47, respectively. Amplifiers 46 and 47 have adjustable gains which are controlled by a common AGC unit comprising a fast AGC circuit 48 and a slow AGC circuit 49. Isolation diodes D1 and D2 conduct the output signals from amplifiers 48 and 49, respectively, to the fast AGC circuit 48 and slow AGC circuit 49. The two amplifier output signals are also connected to jack 34 which is adapted to receive plug 36 for purposes of transmitting the two signals to earphones 37 via respective volume controls 41 and 42. Alternatively, or additionally, the two channel signals may be transmitted to earphones 37' by first applying the signals to a stereo multiplex encoder 51 from which the stereo encoded signals are applied to an FM transmitter 52. An FM stereo receiver 53, having independent volume controls 54, 56 for each channel of the received binaural signal, applies the signal to earphones 37'.

In operation, diodes D1 and D2 assure that the AGC unit, which is common to both signal channels, responds only to the channel having the signal with the higher amplitude at any time. Thus, if the signal transduced by microphone 23 is of larger amplitude than a signal transduced by microphone 24, the signal from amplifier 46 will have a greater amplitude and will, therefore, control the AGC operation. However, the gain control signal from the AGC circuits is applied to both amplifiers 46 and 47 so that the relative difference between the signal amplitudes in the two channels is maintained. The system, therefore, maintains the interaural level differential between the contralateral and ipsilateral sounds and, therefore, quite accurately simulates actual hearing.

The fast AGC circuit 48, as its name implies, responds to the amplitude sensing signal applied thereto much more rapidly than does the slow AGC circuit 49. More specifically, the slow AGC circuit 49 effects gain channels at amplifiers 46 and 47 only in response to relatively long-term changes in the amplitude of the received signals. The fast AGC circuit 48, on the other hand, responds to suppress sudden sharp loud noises which could cause considerable discomfort to a user of the system. More specifically, when the gain of amplifiers 46 and 47 is maintained at a level consistent with the average signal level passing through the system, a sudden loud sound in the vicinity would pass through the system at this relatively high gain level if it were not for the fast AGC circuit 48. This amplified loud sound has caused considerable distress among hear aid users in the past.

The output signals from the two gain-controlled channels are, as noted above, transmitted to the user's earphones by cable or wireless transmission. In either case, the user can adjust the level of each channel signal independently to accommodate his or her own hearing impairment.

Figure 5:
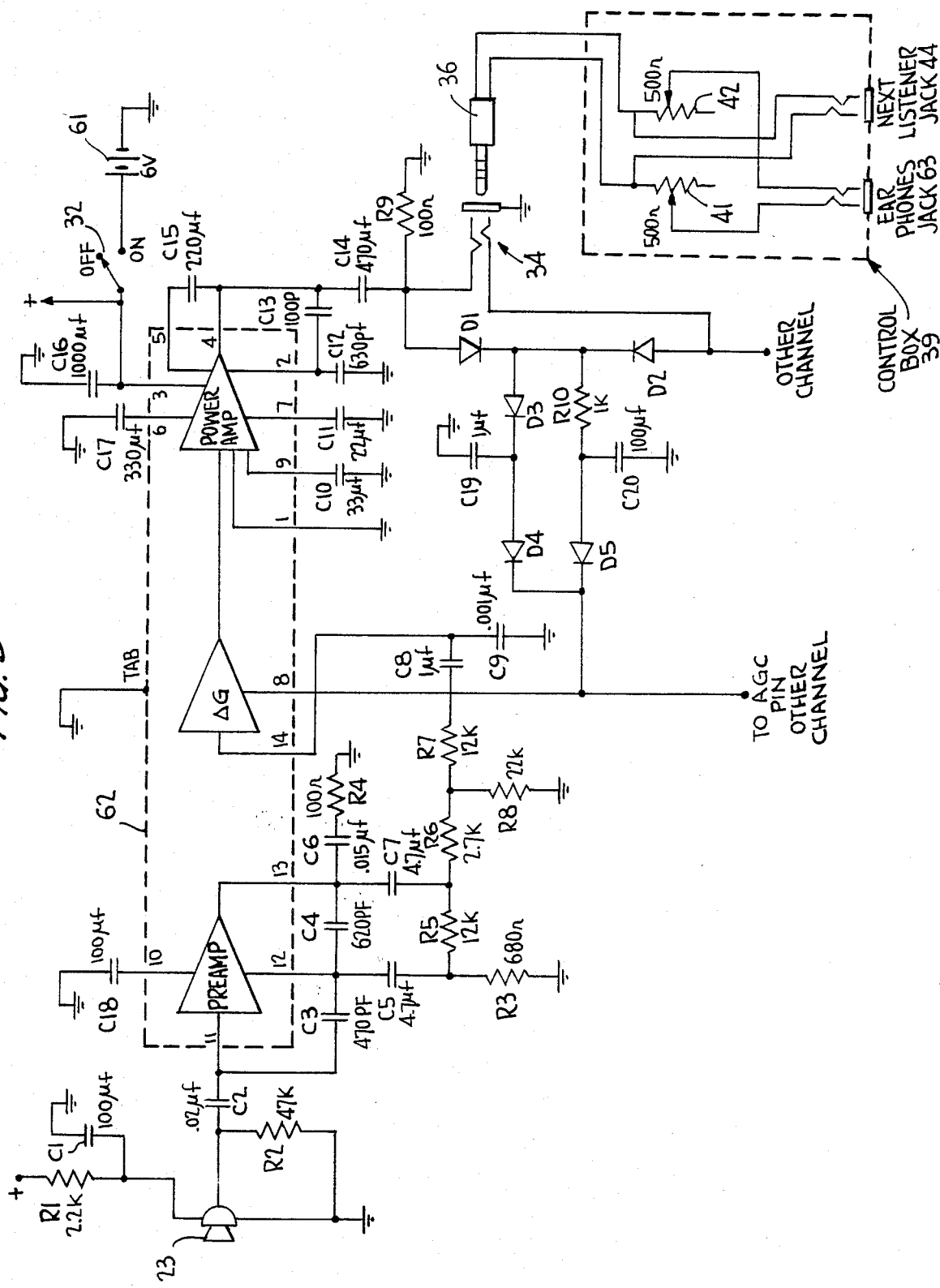
FIG. 5 is an electrical schematic diagram of a portion of the system of FIG. 4.

Referring to FIG. 5 of the accompanying drawings, there is illustrated a schematic diagram of a portion of the circuit of FIG. 4 showing only one of the two channels and the common AGC circuits. The on-off switch 32, shown in the upper right-hand corner of the Figure, provides a positive DC voltage, nominally 6 Volts, from a battery 61 to power the entire console circuit. The battery is shown returned to circuit ground which serves as a reference for the various voltage levels employed in the system. Microphone 23 is illustrated as being powered from the positive supply voltage applied across the resistor R1 and the microphone to ground. A capacitor C1 is connected from the junction of resistor R1 and the microphone to ground. The signal transduced by the microphone is applied across the resistor R2 to ground and through a decoupling capacitor C2 to pin 11 of an integrated circuit chip 62. The particular chip illustrated is a model HA1361 manufactured by Hitachi, Ltd., Semi-Conductor and Integrated Circuit Division, Tokyo, Japan. This chip is used for convenience only and any amplifier circuit having an automatically adjustable gain may be employed instead. Chip 62 is illustrated as including three amplifier stages, namely a pre-amplifier followed by a gain-control amplifier which is then followed by a power amplifier. The amplified output signal from the chip is provided at pin 4. Other chip pin connections include: capacitor C3 connected between pins 11 and 12; capacitor C4 connected between pins 12 and 13; capacitor C5 and resistor R3 connected in series from pin 12 to ground; capacitor C6 and resistor R4 connected in series between pin 13 and ground; capacitor C7 and resistor R5 connected in series between pin 13 and the junction between capacitor C5 and resistor R3; capacitor C9 connected between pin 14 and ground; the gain control signal line from the AGC circuits connected to pin 8; a ground connection at pin 1; capacitor C10 connected between pin 9 and ground; capacitor C11 connected between pin 7 and ground; capacitor C12 connected between pin 2 and ground; capacitor C13 connected between pins 2 and 4; one end of capacitor C14 connected to pin 4; capacitor C15 connected between pins 4 and 5; capacitor C16 connected between pin 3 and ground; capacitor C17 connected between pin 6 and ground; and capacitor C18 connected between pin 10 and ground.

A resistor R6 is connected in series with a resistor R7 between the other end of capacitor C8 and the junction between resistor R5 and capacitor C7. A further resistor R8 is connected between ground and the junction between resistors R6 and R7.

The other end of capacitor C14 is connected to the anode of isolation diode D1, to one contact of jack connector 34, and to one end of a resistor R9, the other end of which is connected to ground. The cathode of diode D1 is connected to the cathode of diode D2 from the other channel circuit and to the input of the fast and slow AGC circuits. The fast AGC circuit includes a diode D3 having its anode connected to the cathodes of diodes D1 and D2 and having its cathode connected to one side of a capacitor C19. The other side of capacitor C19 is connected to ground. The junction between diode D3 and capacitor C19 is connected to the anode of diode D4 which has its cathode connected to the common gain control signal line. The slow AGC circuit includes a resistor R10 connected at one end to the cathodes of diodes D1 and D2 and at its other end to one side of a capacitor C20. The other side of capacitor C20 is connected to ground. The junction between resistor R10 and capacitor C20 is connected to the anode of a diode D5, the cathode of which is connected to the cathode of diode D4 and to the common gain control signal line.

The control box 39 is illustrated schematically as receiving the two channel output signals via cable 38. These signals are adjustable in amplitude via volume controls 41 and 42, respectively, before being applied to the earphone jack 63. The signals are also passed to jack 44 without passing through volume controls 41 and 42 so that they may be used by another user via another control box 39'.

The amplifier circuit employs capacitors C3, C4, C5 and C7 and resistors R3 and R5 as part of a filter circuit to shape the frequency response of the overall amplifier. The overall system provides a frequency response with a relatively high gain section between 3,000 and 6,000 Hz. The high gain section is preferably flat between 4,500 and 6,000 Hz. A roll-off is provided below 200 Hz. Resistors R6, R7 and R8 serve to attenuate the signal passed from the pre-amplifier stage to the gain-control stage so that the resulting range of the signal is useful in the present invention. Without such attenuation, the overall gain of the particular chip 62 (namely, the HA1361) would provide too much signal level for use in the device of the present invention. Capacitor C6 and resistor R4 represent a typical load circuit employed across a transistor amplifier wherein the low resistance resistor determines the impedance above the RC cut-off frequency, but the frequency variable capacitive impedance controls the impedance below the cut-off frequency.

The AGC unit operation depends upon the fact that capacitor C19 in the fast AGC circuit has a much lower capacitance than does capacitor C20 in the slow AGC circuit. In addition, the impedance of the charge or attack path for capacitor C19 is much less than that for capacitor C20. The charge or attack time constant for the slow AGC capacitor C20 is on the order of 100 milliseconds whereas the charge or attack time for capacitor C19 in the fast AGC circuit is on the order of 100 microseconds. Thus, capacitor C20 will charge relatively slowly and then maintain the gain in both channels at some level corresponding to the average amplitude of the higher amplitude signal picked up by microphones 23 and 24. As this average amplitude decreases, the gain in the two channels is increased; likewise, as the average amplitude increases, the gain in the two channels is decreased. As a result, the output signals transmitted to the earphones remain in a predetermined amplitude range. In this regard, capacitor C20 charges through resistor R10 to establish the gain control signal level through diode D5. Discharge of capacitor C20 is through resistor R10 and the reverse current flow paths of diodes D1 and D2 connected in parallel. The reverse impedance of each of these diodes is on the order of 200,000 Ohms, thereby providing a very long time constant (on the order of 10 seconds) for discharge or decay of capacitor C20.

The charge path for the fast AGC capacitor C19 is through diode D3 in the forward direction. Sudden amplitude increases in the higher amplitude signal from diodes D1 and D2 effect rapid charge of capacitor C19, assuming that such increase is above the conduction threshold of diode D3. The rapid charge provided across capacitor C19 is passed through diode D4 to the common gain control signal line to quickly reduce the gain in both channels and thereby prevent sudden loud noises from passing through the system. It is important, however, that the system does not inhibit the onset of all sounds; otherwise, the initial portion of a spoken word might be lost due to the gain control arrangement. The threshold established by diode D3 is employed to prevent capacitor C19 from charging in response to sudden "normal" level sounds. In this respect, diode D3 is a silicon diode as compared to diodes D1, D2, D4 and D5 which are germanium diodes. The forward voltage drop or threshold of silicon diodes is normally between 0.5 and 0.6 volts whereas the forward voltage drop of germanium diodes is on the order to 0.2 volts, or less. If a greater threshold for the fast AGC circuit is desired, two or more silicon diodes may be placed in series to serve as diode D3. Alternatively, a combination of silicon and germanium diodes may be so used. This discrimination between sudden sharp noises and the onset of normal level sounds is one of the important aspects of the present invention.

Discharge of capacitor C19 to the voltage level stored in the much larger capacitor C20 is effected through the series combination of diode D4 in the forward direction and diode D5 in the reverse direction. Discharge through diode D3 is virtually non-existent because the reverse impedance of silicon diodes is effectively infinite. Germanium diode D5, however, has a finite reverse impedance on the order of 200,000 Ohms. Typically, the discharge time constant for capacitor C19 is on the order to 200 milliseconds.

In considering the attack or charge path for the slow AGC capacitor C20, it should be borne in mind that the charging signal has a parallel charge path provided by the fast AGC circuit. This effectively lowers the voltage to which the slow AGC circuit charges, thereby making the effective charge or attack time slower for purposes of producing a gain reduction in the amplifier channels.

Diodes D1 and D2 serve two primary functions. First, they prevent cross-coupling between channels. That is, the gain sensing signal passed by diode D1 for the illustrated channel cannot pass through diode D2 to the other channel, and vice versa. In addition, diodes D1 and D2 rectify the sensing signals applied to the AGC circuits so that only one polarity (e.g. positive) signal is applied to the capacitors C19 and C20.

It is assumed, and this is necessarily the case, that the impedance presented at the gain control pin 8 in the amplifier chip 62 is infinite and, therefore, does not effect the charging or discharging of capacitors C19 and C20. Further, the charging and discharging times described above for capacitors C19 and C20 are those employed in the preferred specific embodiment of the invention, but should not be construed as limiting the scope of the invention. It is sufficient, for example, if the attack time for the fast AGC circuit is faster than the slow AGC circuit attack time by approximately a factor of 100 or more. Typically, the fast AGC attack time should be considerably less than a few milliseconds whereas the slow AGC attack time should be considerably greater than a few milliseconds. The discharge or decay time for the fast AGC circuit should be slightly longer than the attack time for the slow AGC circuit, but much faster than the decay time for the slow AGC circuit. Typically, the fast AGC decay time should be less than a second; the slow AGC decay time should be greater than one second and, preferably, on the order of 10 seconds or more.

The component values described in FIG. 5 are presented by way of example only to illustrate the best mode of the present invention. These values, however, are by no means intended to limit the scope of the present invention. In addition to the listed components, the germanium diodes D1, D2, D4 and D5 may be type 1N270 or other equivalent types. Silicon diode D3 may be type 1N914, 1N619 or other equivalent.

Figure 6:
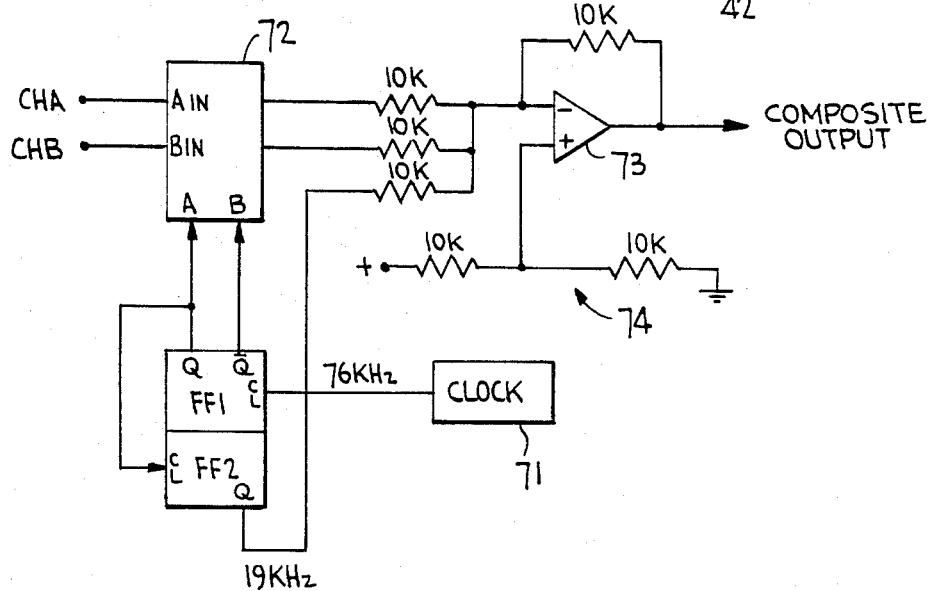
FIG. 6 is a schematic diagram of a multiplex encoder employed as part of the wireless transmission embodiment of the present invention.

The circuit of FIG. 5 is shown with connections to control box 39 to illustrate the wire transmission mode of operation. As noted above with relation to FIG. 4, the system also operates in a wireless transmission mode. For such operation, FM transmitter 52 can be any low power FM transmitter, such as that contained in the Tandy Model 33-1075 "FM Wireless Microphone" and receiver 53 may take the form of the Model IS114 Stereo FM Receiver manufactured by Unitech. Earphones 37 and 37' may be the Sony Model MDR-E33 which are high-fidelity earphones employing comfortable over-the-ear ear pieces. The stereo multiplex encoder 51 may take the general configuration illustrated in FIG. 6 wherein a clock 71 provides a 76 KHz master clock signal to the clock terminal of a flip-flop FF1. The Q output signal from flip-flop FF1, which has a frequency of 38 KHz (half the master clock frequency) is applied to the clock terminal of a second flip-flop FF2. The Q and $\overline{Q}$ signals are applied to the A and B control terminals, respectively, of a bilateral switch 72. Bilateral switch 72 may take the form of a Quad Bilateral Switch manufactured by National Semi-Conductor Corporation as Part No. CD 4066. This device operates to pass or block signals applied to its A IN terminal and its B IN terminal in accordance with the binary state of the A and B control terminals. The A IN terminal receives its signal from amplifier 46 of FIG. 4; the B IN terminal receives the other channel output signal from amplifier 47. The channel signals passed by bilateral switch 72 are conducted through respective resistors to the inverting input terminal of an operational amplifier 73 which provides the composite output signal for the FM transmitter 52. A third component of this composite signal is the Q output signal from flip-flop FF2 which is at 19 KHz, or one-quarter of the master clock frequency. The non-inverting input terminal of amplifier 73 is maintained at a constant positive reference voltage level by a voltage divider network 74.

In operation, the signal passed by bilateral switch 72 is made up of a 19 KHz signal from the flip-flop FF2 and a 38 KHz signal which, in alternate half-cycles, has the amplitude of the two channel signals. The 19 KHz signal is used at the demodulator of the FM receiver, in a conventional manner, as a pilot signal, to derive the sub-carrier at 38 KHz. It is also employed to determine if the stereo-transmitted signal is present. The 19 KHz signal is typically transmitted at a much lower level than the information signal.

While I have described and illustrated various specific embodiments of my invention, it will be clear that variations from the details of construction which are specifically illustrated and described may be resorted to without departing from the true spirit and scope of the invention as defined in the appended claims.

What is claimed is:

1. A device for the hearing impaired comprising:
   a portable console adapted to be positioned close to a source of sound and having a first exposed surface with a surface portion that is not recessed with respect to the rest of said first surface;
   first and second omni-directional microphone means mounted on said console, spaced to simulate human binaural auditory reception, for transducing acoustic waves in the environment surrounding said console inot first and second received signals, respectively, said first and second microphone means being mounted flush with said surface portion to eliminate pickup at said first and second microphone means of acoustic energy reflected by said first surface;
   first and second channel circuits for processing said first and second received signals, respectively, to provide first and second processed signals;
   first and second earphones located remote from said console for transducing electrical signals transmitted thereto into corresponding acoustic signals; and
   signal transmission means for transmitting said first and second processed signals to said first and second earphones, respectively.

2. The device according to claim 1 wherein said first exposed surface is a top surface of said console.

3. A device for the hearing impaired comprising:
   a portable console adapted to be positioned close to a source of sound;
   first and second microphone means mounted on said console, spaced to simulate human binaural auditory reception, for transducing acoustic waves in the environment surrounding said console into first and second received signals, respectively;
   first and second channel circuits for processing said first and second received signals, respectively, to provide first and second processed signals;
   first and second earphones located remote from said console for transducing electrical signals transmitted thereto into corresponding acoustic signals;
   signal transmission means for transmitting said first and second processed signals to said first and second earphones, respectively;
   means for deriving a first sensing signal having an amplitude representative of the amplitude of said first processed signal;
   means for deriving a second sensing signal having an amplitude representative of the amplitude of said second processed signal;
   common automatic gain control circuit means responsive to said first and second sensing signals for providing, on a gain control line, a common gain control signal having an amplitude which is a function of the amplitude of a selected sensing signal corresponding to whichever of the first and second sensing signals has a higher amplitude;
   first adjustable gain amplifier means responsive to said common gain control signal for maintaining the amplitude of said first processed signal within a first predetermined amplitude range; and
   second adjustable gain amplifier means responsive to said common gain control signal for maintaining the amplitude of said second processed signal within a second predetermined amplitude range.

4. The device according to claim 3 wherein said common automatic gain control circuit means comprises parallel-connected fast and slow control circuits;
   wherein said fast gain control circuit includes:
      first energy storage means and a first charging path for storing said selected sensing signal in said first energy storage means, said first charging path and said first energy storage means having a combined charging time constant of much less than a few milliseconds and further including first coupling means for coupling the signal stored in said first energy storage means to said common gain control line;
   wherein said slow gain control circuit includes:
      second energy storage means and a second charging path for storing said selected sensing signal in said second energy storage means, said second charging path and said second energy storage means having a combined charging time constant of much greater than a few milliseconds, and further including second coupling means for coupling the signal stored in said second energy storage means to said common gain control line.

5. The device according to claim 4 wherein said fast gain control circuit comprises threshold limiting means for inhibiting charging of said first energy storage means unless said sensing signal exceeds a predetermined threshold amplitude, and wherein said second energy storage means begins charging at a lower amplitude of said sensing signal.

6. The device according to claim 4 further comprising first and second diodes and wherein said first and second sensing signals are derived from said first and second processed signals, respectively, by passing said first and second processed signals through said first and second diodes, repectively, to a common input junction; and wherein said first and second energy storage devices include first and second capacitors, respectively, said second capacitor having a much larger capacitance than said first capacitor;
   wherein said first charging path includes a third diode connected between said common input junction and one side of said first capacitor, the second side of said first capacitor being connected to a circuit reference potential, said third diode being connected to conduct current flow in the same polarity sense as said first and second diodes with respect to said first capacitors;
   wherein said first coupling means includes a fourth diode connected between said one side of said first capacitor and said common gain control line;
   wherein said second charging path includes a resistance connected between said common input junction and one side of said second capacitor, the second side of said second capacitor being connected to a circuit reference potential, wherein said resistance is very much greater than the forward conducting resistance of the third diode; and wherein said second coupling means comprises a fifth diode connected between one side of said second capacitor and said common gain control line.

7. The device according to claim 6 wherein said third diode has a higher forward conduction voltage drop than said fourth and fifth diodes.

8. The device according to claim 6 wherein said first, second, fourth and fifth diodes are germanium diodes and wherein said third diode is a silicon diode.

9. The device according to claim 1 wherein said first and second channel circuits have gain versus frequency characteristics which are relatively high gain and flat between 4,500 Hz and 6,000 Hz and which roll off sharply below 200 Hz.

10. The device according to claim 9 wherein said gain versus frequency characteristics include a relatively high gain section between 3,000 and 6,000 Hz.

11. The device according to claim 1 wherein the spacing between said first and second microphone means is between 3 and 14 inches.

12. The device according to claim 11 wherein the spacing between said first and second microphone means is between 8 and 10½ inches.

13. The device according to claim 1 wherein said transmission means comprises a conductor means for conducting said first and second processed signals to said first and second earphones, respectively.

14. The device according to claim 13 further comprising volume control means for permitting selective independent adjustment of the amplitudes of each of said first and second processed signals.

15. The device according to claim 13 wherein said conductor means comprises:
a dual signal jack connection on said console;
means connecting said first and second processed signals to said jack connection;
first cable means, including a plug adapted to mate with said jack connection, for conducting said first and second processed signals away from said console;
a control box connected to receive said first and second processed signals from said first cable means and including first and second volume control means to permit selective independent adjustment of the amplitudes of said first and second processed signals, respectively; and
further cable means for conducting the amplitude-adjusted first and second processed signals from said control box to said first and second earphones, respectively.

16. The device according to claim 15 wherein said control box further comprises:
a further dual signal jack connection;
means connecting the received first and second processed signals, prior to amplitude adjustment, to said jack connection;
whereby a second cable means, substantially identical to said first cable means, can be connected by its plug to said further jack connection to conduct said first and second processed signals to a further control box.

17. The device according to claim 1 wherein said transmission means comprises:
radio transmitter means for transmitting said first and second processed signals;
radio receiver means located remote from said console and adapted to be carried by a user, for receiving the first and second processed signals transmitted by said radio transmitter means; and
wiring means for conducting the received first and second processed signals from said radio receiver to said first and second earphones respectively.

18. The device according to claim 17 further comprising first and second volume control means for permitting selective independent adjustment of the amplitudes of said received first and second signals, respectively, which are conducted to said earphones.

19. The device according to claim 17 further comprising a plurality of console units, each having:
first and second microphone means mounted thereon and spaced to simulate human binaural auditory reception for transducing acoustic waves in the environment surrounding that console unit into separate received signals;
first and second channel circuits for processing the further received signals, respectively, to provide respective further processed signals; and
frequency modulation radio transmission means for transmitting said further processed signals;
said device further comprising frequency modulation stereo receiver means for receiving the transmission of said further processed signals from said radio transmission means in separate channels such that the highest level received radio signal from said console units is rendered audible at said first and second earphones.

20. The device according to claim 21 wherein said fast gain control circuit comprises threshold limiting means for inhibiting charging of said first energy storage means unless said sensing signal exceeds a predetermined threshold amplitude, and wherein said second energy storage means begins charging at a lower amplitude of said sensing signal.

21. A device for the hearing impaired comprising:
first and second microphone means spaced to simulate human binaural auditory reception, for transducing acoustic waves in the surrounding environment into first and second received signals, respectively;
first and second channel circuits for processing said first and second received signals, respectively, to provide first and second processed signals;
first and second earphones for transducing said first and second processed signals into corresponding acoustic signals;
means for deriving a first sensing signal having an amplitude representative of the amplitude of said first processed signals;
means for deriving a second sensing signal having an amplitude representative of the amplitude of said second processed signals;
common automatic gain control circuit means responsive to said first and second sensing signals for providing, on a gain control line, a common gain control signal having an amplitude which is a function of the amplitude of a selected signal corresponding to whichever of the first and second sensing signals has a higher amplitude;
first adjustable gain amplifier means responsive to said common gain control signal for maintaining the amplitude of said first processed signal within a first predetermined amplitude range; and second adjustable gain amplifier means responsive to said common gain control signal for maintaining the amplitude of said second processed signal within a second predetermined amplitude range;

wherein said common automatic gain control circuit means comprises:

parallel-connected fast and slow control circuits;

wherein said fast gain control circuit includes:

first energy storage means and a first charging path for storing said selected sensing signal in said first energy storage means, said first charging path and said first energy storage means having a combined charging time constant of much less than a few milliseconds and further including first coupling means for coupling the signal stored in said first energy storage means to said common gain control line;

wherein said slow gain control circuit includes:

second energy storage means and a second charging path for storing said selected sensing signal in said second energy storage means, said second charging path and said second energy storage means having a combined charging time constant of much greater than a few milliseconds, and further including second coupling means for coupling the signal stored in said second energy storage means to said common gain control line.

22. A system employing a plurality of devices according to claim 21, each device further comprising:

frequency modulation stereo radio transmission means for transmitting said first and second processed signals;

stereo frequency modulation radio receiver means for receiving said first and second processed signals transmitted by said transmission means and applying said processed signals to said first and second earphones, respectively;

wherein said receiver means provides only the processed signals received from the highest level received frequency modulation transmission.

23. A method of improving auditory reception for the hearing impaired, said method comprising the steps of:

(a) transducing acoustic waves into first and second received signals by means of two microphones mounted on a top surface of a portable console and spaced to permit binaural phase displacement between said signals;

(b) processing the received signals by automatically adjusting the amplitude thereof so as to discriminate against and substantially eliminate sudden loud sounds above a predetermined amplitude from the processed signals;

(c) transmitting the processed signals to respective earphones located remotely from said console; and (d) eliminating pickup at said microphones of acoustic energy reflected by said top surface by mounting said microphones flush with a portion of said top surface which is not recessed relative to the rest of said top surface.

* * * * *